(12) United States Patent
Abdelfattah Aly et al.

(10) Patent No.: US 11,068,228 B2
(45) Date of Patent: Jul. 20, 2021

(54) BOARD-LEVEL NOISE REDUCTION DURING HEADPHONE LOAD CURRENT SENSING

(71) Applicant: QUALCOMM Incorporated, San Diego, CA (US)

(72) Inventors: Khaled Mahmoud Abdelfattah Aly, Irvine, CA (US); David Ta-hsiang Lin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/833,346

(22) Filed: Mar. 27, 2020

(65) Prior Publication Data

US 2020/0310740 A1 Oct. 1, 2020

Related U.S. Application Data

(60) Provisional application No. 62/825,147, filed on Mar. 28, 2019.

(51) Int. Cl.
| | |
|---|---|
| *H04R 5/04* | (2006.01) |
| *G06F 3/16* | (2006.01) |
| *H04R 1/10* | (2006.01) |
| *G10K 11/16* | (2006.01) |
| *H03F 3/20* | (2006.01) |

(52) U.S. Cl.
CPC ............. *G06F 3/162* (2013.01); *G10K 11/16* (2013.01); *H04R 1/1091* (2013.01); *H03F 3/20* (2013.01); *H03F 2200/03* (2013.01)

(58) Field of Classification Search
CPC ....................................................... H04R 5/04
See application file for complete search history.

(56) References Cited

U.S. PATENT DOCUMENTS

2011/0033060 A1* 2/2011 Johnson .............. H04M 1/6008
381/71.6

* cited by examiner

*Primary Examiner* — Ping Lee

(57) ABSTRACT

An audio codec system includes an audio driver path coupled to a first node of the audio codec system. A first terminal of a sense resistor external to the audio codec system is coupled to the first node and a second terminal of the sense resistor is coupled to an auxiliary device load. The audio codec system includes a second path having a first bias circuit, a second bias circuit and an off-chip voltage reference. The first bias circuit is coupled to a second node of the audio codec system. The second bias circuit is coupled to a third node of the audio codec system. The off-chip voltage reference is associated with the auxiliary device load coupled between the first bias circuit and the second bias circuit.

20 Claims, 6 Drawing Sheets

BOARD-LEVEL NOISE REDUCTION DURING HEADPHONE LOAD CURRENT SENSING

CROSS-REFERENCE TO RELATED APPLICATION

The present application claims the benefit of U.S. Provisional Patent Application No. 62/825,147, filed on Mar. 28, 2019, and titled "BOARD-LEVEL NOISE REDUCTION DURING HEADPHONE LOAD CURRENT SENSING," the disclosure of which is expressly incorporated by reference herein in its entirety.

TECHNICAL FIELD

The present disclosure relates generally to board-level noise reduction and, more specifically, to reducing or eliminating board-level noise when sensing load current of a headphone.

BACKGROUND

A headphone output (e.g., 3.5 mm jack, USB) on a mobile or other device (e.g., desktop personal computer (PC), treadmill, etc.) may be configured to send and/or receive analog and digital data with auxiliary devices such as acoustic, optical, and electromagnetic devices (e.g., FM radio transmitter, credit card readers, audio and video signals, etc.).

Electrical load model for auxiliary devices (e.g., headphones) differs between auxiliary device suppliers. Mobile device manufactures are always looking for flexibility to handle different auxiliary devices to provide users with a certain level of experience regardless of their choices in auxiliary devices. Further, auxiliary devices are being designed with ancillary features. For example, headphone are being used to enable many features including frequency equalization for optimal listening experience, heart rate and other vital sign measurements, biometrics authentication to identify a user, in-ear detection, and so on. Such features can be enabled through estimating both voltage on the headphone load and current through the headphone. A conventional way to sense a load current is to add a sense resistor in series with the headphone load and measure the voltage across the sense resistance. Conventional measurement implementations, however, degrade signal to noise ratio.

SUMMARY

An audio codec system includes an audio driver path coupled to a first node of the audio codec system. A first terminal of a sense resistor external to the audio codec system can be coupled to the first node. A second terminal of the sense resistor can be coupled to an auxiliary device load. The audio codec system also includes a second path. The second path includes a first bias circuit, a second bias circuit, and an off-chip voltage reference. The first bias circuit is coupled to a second node of the audio codec system. The second bias circuit is coupled to a third node of the audio codec system. The off-chip voltage reference is associated with the auxiliary device load and can be coupled between the first bias circuit and the second bias circuit.

An audio codec system includes an audio driver path coupled to a first node of the audio codec system, a first terminal of a sense resistor external to the audio codec system coupled to the first node and a second terminal of the sense resistor coupled to an auxiliary device load. The audio codec system also includes a second path. The second path includes first means for biasing the audio codec system, second means for biasing the audio codec system, and an off-chip voltage reference. The first biasing means is coupled to a second node of the audio codec system. The second biasing means is coupled to a third node of the audio codec system. The off-chip voltage reference is associated with the auxiliary device load coupled between the first biasing means and the second biasing means. A method reduces board-level noise when sensing a load current of an auxiliary device by an audio codec system. The method includes detecting a reference voltage associated with the auxiliary device. The auxiliary device is coupled to a first node associated with an audio driver path within the audio codec system via a sense resistor. The load current is sensed based on the sense resistor. The method also includes applying the reference voltage between a first resistor and a second resistor in a second path within the audio codec system. The first resistor is coupled to a first current source in the second path and a second node of the audio codec system. The second resistor is coupled to a second current source in the second path and a third node of the audio codec system.

A method reduces board-level noise when sensing a load current of an auxiliary device by an audio codec system. The method includes detecting a reference voltage associated with the auxiliary device. The auxiliary device is coupled to a first node associated with an audio driver path within the audio codec system via a sense resistor. The load current is sensed based on the sense resistor. The method also includes applying the reference voltage between a first resistor and a second resistor in a second path within the audio codec system. The first resistor is coupled to a third resistor in the second path and a second node of the audio codec system. The second resistor is coupled to a fourth resistor in the second path and a third node of the audio codec system.

The foregoing summary has broadly outlined the features and technical advantages of the present disclosure so that the detailed description that follows may be better understood. Although aspects of the present disclosure are described with respect to wired auxiliary devices (e.g., wired headphones coupled to a headphone jack), the disclosure is equally applicable to wireless auxiliary devices such as wireless headphones or ear buds. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
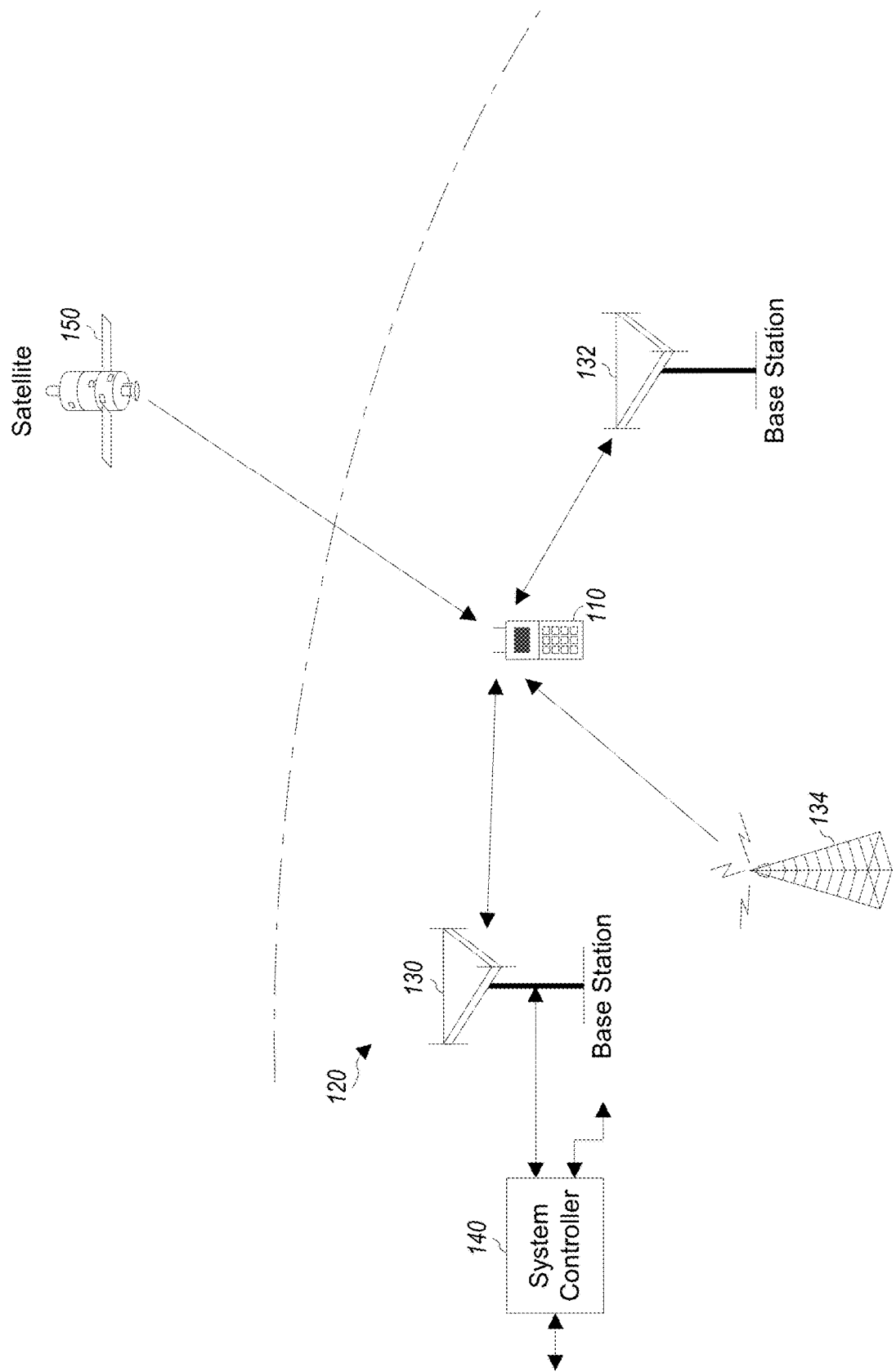
FIG. 1 shows a wireless device communicating with a wireless system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form to avoid obscuring such concepts.

Aspects of the present disclosure are directed to reducing board (e.g., printed circuit board) ground noise from corrupting the sensed current. In one aspect, an audio codec system is coupled to external features (or off-chip components) for sensing load current of an auxiliary device (e.g., headphone). The audio codec system includes a first path (or audio driver path) and a second path. In some aspects, the second path includes a differential signal as input and an output signal that is a function of the differential input signal. The output signal may be an analog or digital signal. The output can reject any signals that are common mode.

The second path of the audio subsystem may linearly add/subtract the output of the first path (which is coupled back to the chip) to other signals and precede or follow the mathematical operation by an amplification and/or filtering. This can either occur directly on the signal in the analog domain followed by an analog-to-digital converter, or can occur in digital domain after an analog-to-digital operation or can be a combination of the two approaches.

The first path includes a power amplifier to drive the auxiliary device. For example, the first path sends an analog signal from the chip (e.g., audio codec) to the auxiliary device or external audio device (e.g., headphone) to "drive" the external audio device.

The auxiliary device may be represented by a load (e.g., Rload). In one aspect, the auxiliary device may be a headphone or a speaker. The first path is coupled to a first node of the audio codec system. The second path includes a multi-channel communication device, a first resistor, a second resistor, a first current source, a second current source, and a reference node between the first resistor and the second resistor. In one aspect, the second path receives an analog signal from outside the chip to be processed on the chip. For example, the received analog signal is converted to digital form by the chip. This second path may be used to receive analog signals from a microphone.

The off-chip components may include a sense resistor, a first capacitor, and a second capacitor. The auxiliary device is coupled to the audio codec system via one or more of the off-chip components. For example, a first terminal of the sense resistor may be coupled to the third node via the second capacitor (and to the first node). A second terminal of the sense resistor may be coupled to an auxiliary device load and to the second node via the first capacitor. A voltage difference between the first terminal and the second terminal of the sense resistor is calculated to sense the load current of the auxiliary device. The calculation may be implemented in the second path. For example, a difference between a voltage at the first terminal (corresponding to the third node) and at the second terminal (corresponding to the second node) is calculated and the difference is processed on the chip using one or more implementations. The implementations may include, but are not limited to, conversion from an analog to a digital form, amplifications in the analog form, filtering, adding/subtracting of any other quantities, or a combination thereof.

The first current source is coupled to the first resistor and a second node of the audio codec system. The second current source is coupled to the second resistor and a third node of the audio codec system. An off-chip voltage reference associated with the auxiliary device is applied to the reference node between the first resistor and the second resistor. The sense resistor is coupled between the first terminal (coupled to the third node or the first node) and the second terminal (coupled to the second node). The second node may be coupled to the first capacitor. For example, the first capacitor is between the second node and the second terminal of the sense resistor. The third node may be coupled to the second capacitor. For example, the second capacitor is between the first node and the third node of the audio codec system. The off-chip voltage reference associated with the auxiliary device may be provided to the reference node of the audio codec system. In one aspect, the auxiliary device load includes a wireless headphone (e.g., Bluetooth headphone).

FIG. 1 shows a wireless device 110 communicating with a wireless communications system 120, according to aspects of the present disclosure. The wireless device 110 may be configured to reduce board-level noise when sensing load current of an auxiliary device (e.g., headphone), according to aspects of the present disclosure. The wireless communications system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communications system 120 including two base stations 130 and 132 and one system controller 140. In general, a wireless system may include any number of base stations and any number of network entities.

A wireless device 110 may also be referred to as a user equipment (UE). The user equipment may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. For example, the wireless device 110 may support Bluetooth low energy (BLE)/BT (Bluetooth) with a low energy/high efficiency power amplifier having a small form factor of a low cost.

The wireless device 110 may be capable of communicating with the wireless communications system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communications such as 5G, LTE, CDMA2000, WCDMA, TD-SCDMA, GSM, 802.11, BLE/BT, etc. The wireless device 110 may also support carrier aggregation, which is operation on multiple carriers.

Figure 2:
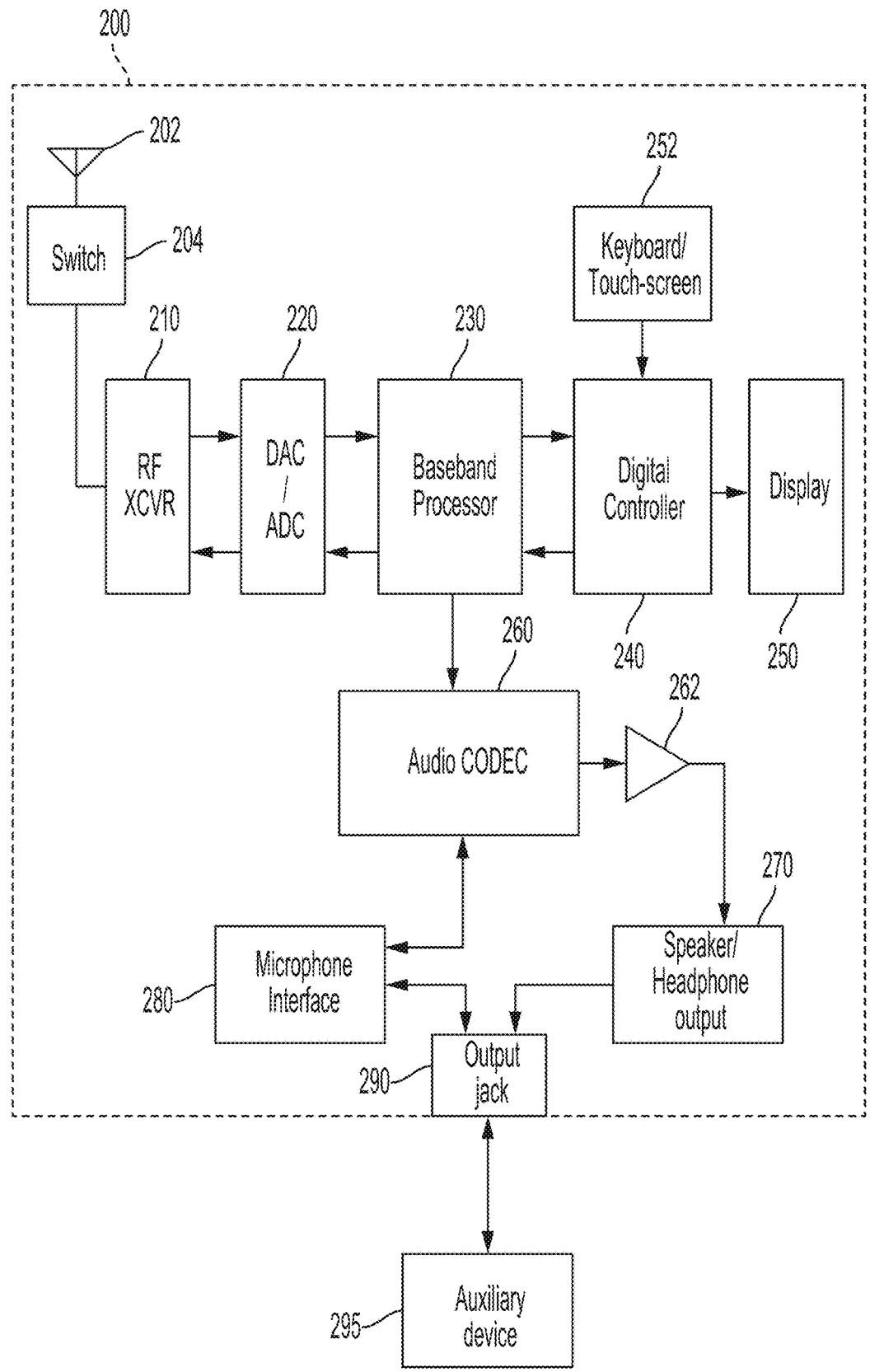
FIG. 2 shows a block diagram of the wireless/mobile device in FIG. 1.

FIG. 2 illustrates a block diagram of an example mobile device 200. The mobile device 200 is one aspect of the mobile device 110 in FIG. 1. The mobile device 200 includes an antenna 202, a switch 204, a radio frequency (RF) transceiver unit 210, a digital-to-analog converter (DAC)/analog-to-digital converter (ADC) 220, a baseband processor 230, a digital controller 240, a display unit 250, and a keyboard/touchscreen 252. The mobile device 200 may also include an audio codec 260 having an audio amplifier, an external amplifier 262, and a speaker/headphone output 270.

The speaker/headphone output 270 may include or be operably coupled to an output jack 290, such as a 3.5 mm phono jack (e.g., miniphono). In other aspects, the output jack 290 may be a USB port, mini USB port, micro USB port, USB type-C port, Apple Lightning® port, or other type of interface configured to carry analog and/or digital signals utilizing a reference voltage and a common ground. In an example, the output jack 290 includes multiple plug configurations such as in an adapter to convert a digital audio output (e.g., Apple Lightning®) to an analog output (e.g., phono jack). The components in the mobile device 200 described herein may be disposed within single form (e.g., within the case of the mobile device), or they may be disposed in one or more additional peripheral devices configured to connect to the mobile device 200 (e.g., within an adapter).

Other components may also be included within, or connected to, the mobile device 200. Those of skill in the art will understand that functions illustrated by the blocks in FIG. 2 may be combined or separated as appropriate. For example, the DAC/ADC 220 may be included in the transceiver unit 210 or the processor 230, and the amplifier 262 may be incorporated in the output 270 instead of being separately or externally implemented in some aspects. Further, element of the transceiver unit 210 may be separated out into different modules, for example LNA and/or PA modules.

The mobile device 200 may include an interface (e.g., a microphone interface 280) configured to interface with an auxiliary device 295 connected to the output jack 290. For headphone load current sensing, the microphone interface 280 is connected or coupled to the output jack 290. However, for other uses (e.g., a regular mobile phone use case), the microphone interface 280 can connect directly to a standalone microphone, which does not connect through a same jack as the speaker/headphone output. Although the auxiliary device 295 is described with respect to a wired connection to the audio codec system, the aspects of the present disclosure are equally applicable to a wireless auxiliary device (e.g., a wireless headphone). For example, in the case of the wireless headphone, the devices 260, 262, 270, 280, 290, and 295 in FIG. 2 are all packaged within the wireless headphone as a complete system (along with a Bluetooth interface between 230 and 260).

The interface may sense a signal across a sense resistor corresponding to the load current. In some aspects, the interface may be a dedicated voltage-in to conditioned signal out block. The dedicated block may cause a signal to be amplified, filtered, digitized, etc. In one aspect, the audio codec 260 can send setup information to the microphone interface 280 in one mode (e.g., mission mode), and the microphone interface 280 sends back observed signals to the audio codec 260. The microphone interface 280 may include power, clock, and logic components configured to provide a reference voltage, a digital signal, and/or power to the auxiliary device 295. The speaker/headphone output 270, the microphone interface 280 and the output jack 290 may be combined into one or more modules. In an example, the microphone interface 280 may be included in the audio codec 260. The mobile device 200 may further include other units (not shown) including a universal serial bus unit (USB), a camera, a wireless network interface unit, a subscriber identity module (SIM) card, a battery, memory unit, etc. It should be noted that not all blocks of the wireless device in FIG. 2 are necessary. For example, the external amplifier 262 may be removed from some configurations, and the speaker/headphone output may be included in the audio codec 260.

The RF transceiver unit 210 includes transmitter circuitry and receiver circuitry. The mobile device 200 uses the transmitter circuitry and the receiver circuitry to communicate with other wireless devices. The transmitter circuitry transmits radio signals and the receiver circuitry receives the radio signals. The transmitter circuitry includes, among other units, an RF up converter that converts modulated baseband signals (e.g., I and Q) either at zero Intermediate frequency (IF) or some IF to RF frequency. The receiver circuitry includes, among other units, an RF down converter that converts RF signals to baseband signals (e.g., I and Q).

The antenna 202 may be a metallic object which converts an electromagnetic signal to an electric signal and vice versa. Example antennas in the wireless device are of various types, such as helix, planar inverted, whip, or patch type. Micro-strip based patch type antennas are often used in mobile devices/phones due to their size, easy integration on the PCB, and multi-frequency band of operation. Since one antenna may be used for both transmit (Tx) and receive (Rx) paths at different times, a Tx/Rx switch 204 may be used to connect both the Tx path and the Rx path with the antenna 202 at different times. For a frequency division duplex (FDD) system, a diplexer may be used in place of the switch which acts as a filter to separate various frequency bands. While not shown, a plurality of antennas may be used in the mobile device 200.

The DAC/ADC 220 may be used to convert the received analog signal to the digital signal and vice versa in the mobile device 200. In the Rx path, a speech signal converted into a digital signal may be sent to the speech coder, such as the audio codec 260. The types of ADCs include sigma delta, flash, dual slope, and successive approximation. Automatic gain control (AGC) and automatic frequency control (AFC) may be used to control gain and frequency. The AGC controls proper maintenance of the DAC by keeping the signal within the dynamic range of the DAC. The AFC controls receiver performance by maintaining the frequency error within a limit.

The baseband processor 230 may convert voice/data to baseband signal. The baseband processor 230 is sometimes referred to as a physical layer (or Layer 1). The baseband processor 230 may add redundant bits to enable error detection (e.g., using cyclic redundancy check (CRC)) and error correction using forward error correction techniques (e.g., a convolutional encoder (used in the Tx path) and a Viterbi decoder (used in the Rx path). The baseband processor 230 may also perform power management and distribution functions.

The audio codec 260 may be used to compress and decompress the signals to match the data rate to the frame. The audio codec 260 may convert the speech signal. The audio codec 260 may couple to the speaker/headphone output 270 through the external amplifier 262. The audio codec 260 may also couple to the output jack 290 through the microphone interface 280. In an example, audio codec 260 may include the microphone interface 280. The digital controller 240 may control data input and output signals such as switching and driving applications, commands, memory accesses, and executions of programs. The digital controller 240 may also interpret and execute commands to and from the user interface including the display unit 250, the keyboard/touchscreen 252, etc. The digital controller 240 may further manage and execute various applications in an application layer (Layer 7). Applications may include audio, video, and image/graphics applications.

Figure 3A:
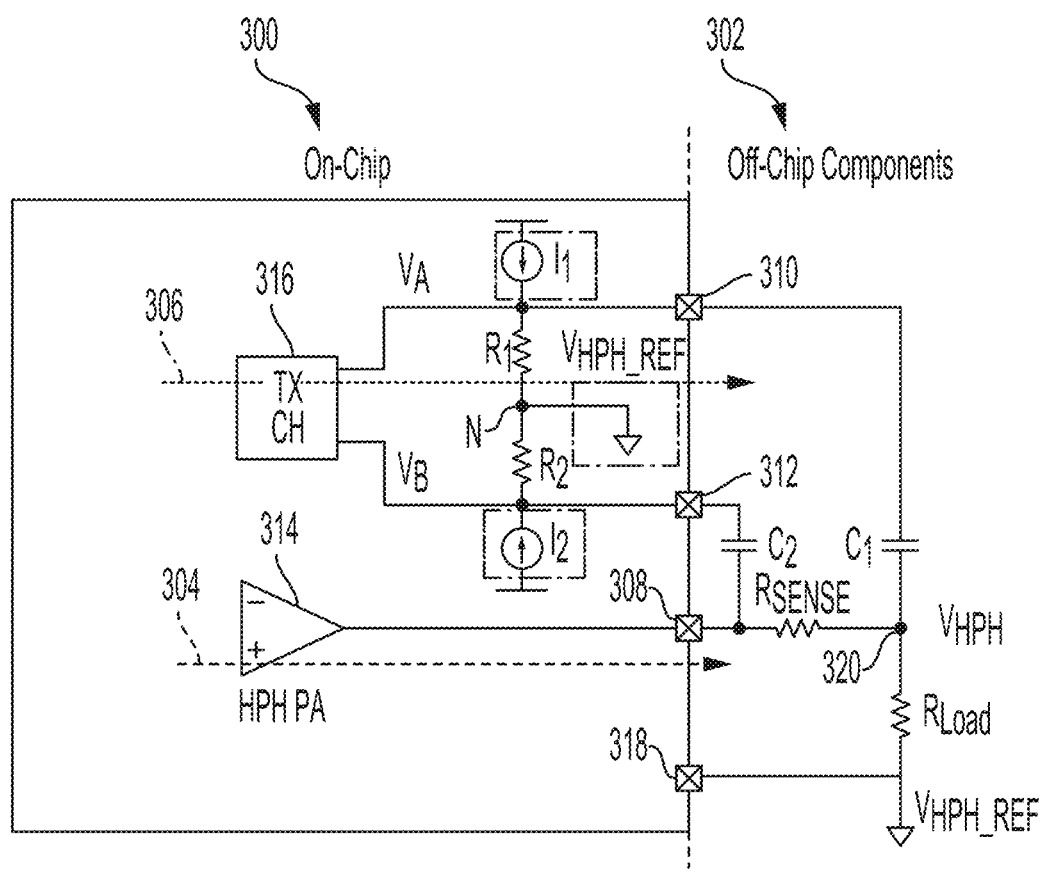
FIG. 3A illustrates an audio codec system coupled to external features for sensing load current of an auxiliary device, according to aspects of the present disclosure.

FIG. 3A illustrates an audio codec system 300 coupled to external features (or off-chip components) 302 for sensing load current of an auxiliary device (e.g., headphone), according to aspects of the present disclosure. The audio codec system 300 includes a first path 304 (or audio driver path) and a second path 306 (e.g., a voltage-in/digital-out path). The first path 304 includes a power amplifier 314 to drive the auxiliary device. The auxiliary device may be represented by a load (e.g., Rload). In one aspect, the auxiliary device may be a headphone or a speaker. The first path 304 is coupled to a first node 308 of the audio codec system 300.

The second path 306 includes a multi-channel communication device 316, a first resistor R1, a second resistor R2, a first current source I1, a second current source I2, and a reference node N between the first resistor R1 and the second resistor R2. A first bias circuit of the audio codec system includes the first current source I1 and the first resistor R1. A second bias circuit of the audio codec system includes the second current source I2 and the second resistor R2. The off-chip voltage reference is coupled between the first resistor R1 and the second resistor R2. The first current source I1 and the second current source I2 are coupled to a supply voltage referenced to ground.

Alternatively, the first bias circuit includes the first resistor $R_1$ coupled to a third resistor (not shown) instead of the first current source $I_1$ and the second bias circuit includes the second resistor $R_2$ coupled to a fourth resistor (not shown). The off-chip voltage reference is coupled between the first resistor $R_1$ and the second resistor $R_2$. The third resistor and the fourth resistor are coupled to a supply voltage referenced to the off-chip voltage reference. For example, when current sources are being used, the external ground is blocked from corrupting the internal nodes because of the large output resistance of the current sources (few mega-ohms). However, when resistors are used, the resistors do not provide the same resistance as the current sources, and therefore the immunity of coupling the ground noise to the internal networks is lost. As a result, an off-chip voltage reference between the resistors (e.g., between the first resistor $R_1$ and the second resistor $R_2$) is specified. The off-chip voltage reference $V_{HPH\_REF}$ is a sense signal tied to the headphone jack ground, which in turn is connected to the main ground at the jack (load).

In one aspect, the multi-channel communication device 316 may sense the load current of an auxiliary device. For example, the multi-channel communication device 316 takes the difference between a voltage at a second node 310 and a voltage at a third node 312, and processes the difference using one or more implementations. The implementations may include, but are not limited to, conversion from an analog to a digital form, amplifications in the analog form, filtering, adding/subtracting of any other quantities, or a combination thereof.

The off-chip components 302 include a sense resistor $R_{SENSE}$, a first capacitor $C_1$, and a second capacitor $C_2$. The auxiliary device is coupled to the audio codec system 300 via the off-chip components 302. For example, a first terminal (which corresponds to the first node 308) of the sense resistor $R_{SENSE}$ is coupled to the first node 308 and a second terminal 320 of the sense resistor $R_{SENSE}$ is coupled to an auxiliary device load (e.g., Rload). A voltage $V_{HPH}$ at the second terminal 320 is an actual audio signal delivered to the headphone which is represented by Rload.

The first current source $I_1$ is coupled to the first resistor $R_1$ and the second node 310 of the audio codec system 300. The second current source $I_2$ is coupled to the second resistor $R_2$ and a third node 312 of the audio codec system 300. An off-chip voltage reference $V_{HPH\_REF}$ associated with the auxiliary device (or Rload) is applied to the reference node N between the first resistor $R_1$ and the second resistor $R_2$. The sense resistor $R_{SENSE}$ is coupled between the second node 310 and the third node 312. The second node 310 may be coupled to the first capacitor $C_1$. For example, the first capacitor $C_1$ is between the second node 310 and the second terminal 320 of the sense resistor $R_{SENSE}$. The third node 312 may be coupled to the second capacitor $C_2$. For example, the second capacitor $C_2$ is between the first node 308 and the third node 312 of the audio codec system 300. In one aspect, the off-chip voltage reference $V_{HPH\_REF}$ associated with the auxiliary device (or Rload) may be provided to the reference node N via a fourth node 318 of the audio codec system 300.

Figure 3B:
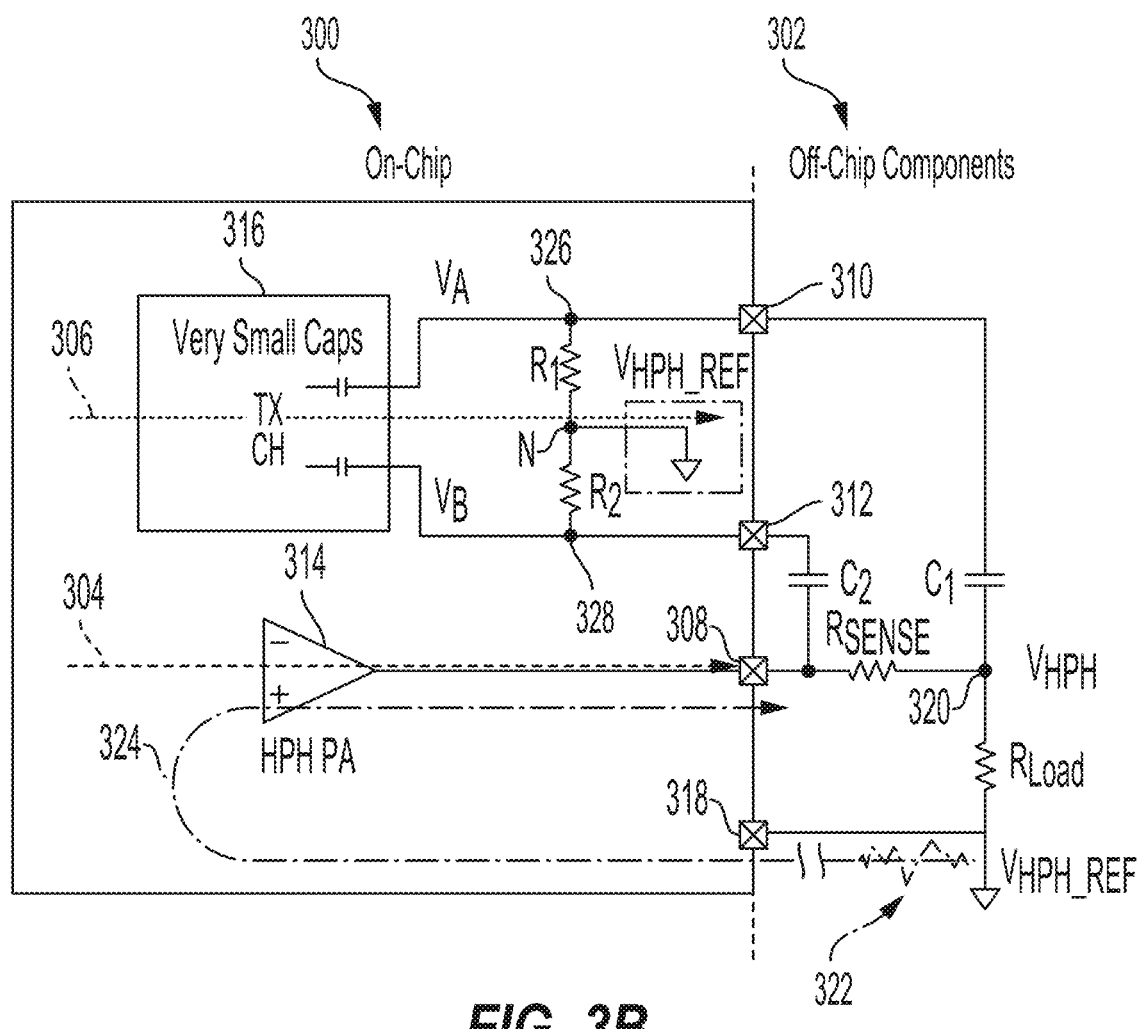
FIG. 3B illustrates an operation of the audio codec system coupled to external features for sensing load current of an auxiliary device, according to aspects of the present disclosure.

FIG. 3B illustrates an operation of the audio codec system 300 coupled to external features for sensing load current of an auxiliary device, according to aspects of the present disclosure. In operation, the first current source $I_1$ (not shown) and the second current source $I_2$ (not shown) are designed to have a large enough output impedance (e.g., resistance) and the first resistor $R_1$ and the second resistor $R_2$ are connected to the off-chip voltage reference $V_{HPH\_REF}$ instead of ground. When the first current source $I_1$ and the second current source $I_2$ have a large enough impedance, then they can be considered an open from an alternating current signal perspective. Accordingly, the first current source $I_1$ and the second current source $I_2$ are left out in FIG. 3B to illustrate their operation as an open from the alternating current signal perspective.

The power amplifier 314 (e.g., headphone power amplifier (HPH PA)) replicates a reference noise 322 at its output (e.g., the first node 308) as illustrated by a third path 324. Replacing a ground connection between the first resistor $R_1$ and the second resistor $R_2$ with the off-chip voltage reference $V_{HPH\_REF}$ ensures that the noise on the reference noise 322 propagates equally to all nodes in the circuit and therefore appears equally at a fourth node 326 corresponding to a voltage $V_A$ and a fifth node 328 corresponding to a voltage $V_B$. The differential input noise is zero and a common mode noise gets rejected by a high common mode rejection ratio (CMRR) of the transmit front end. The second path is a fully differential path, which has the ability to respond only to the differential signal, and reject the common mode signal by the CMRR. The high CMRR is specified to be better than 80 dB in the audio band.

Thus, if an alternating current signal is injected via a reference node (e.g., the reference node N or the fourth node 318) and the transmit input pins (e.g., at the fourth node 326 and the fifth node 328), while mismatching the external capacitors (e.g., the first capacitor $C_1$ and the second capacitor $C_2$), the transmit input pins carry the same alternating current signal as the injected alternating current signal. This follows when the first current source $I_1$ and the second current source $I_2$ are ideal. However, for practical implementations of the first current source $I_1$ and the second current source $I_2$, the mismatch would result in a residual differential signal between the second node 310 and the third node 312.

Figure 4:
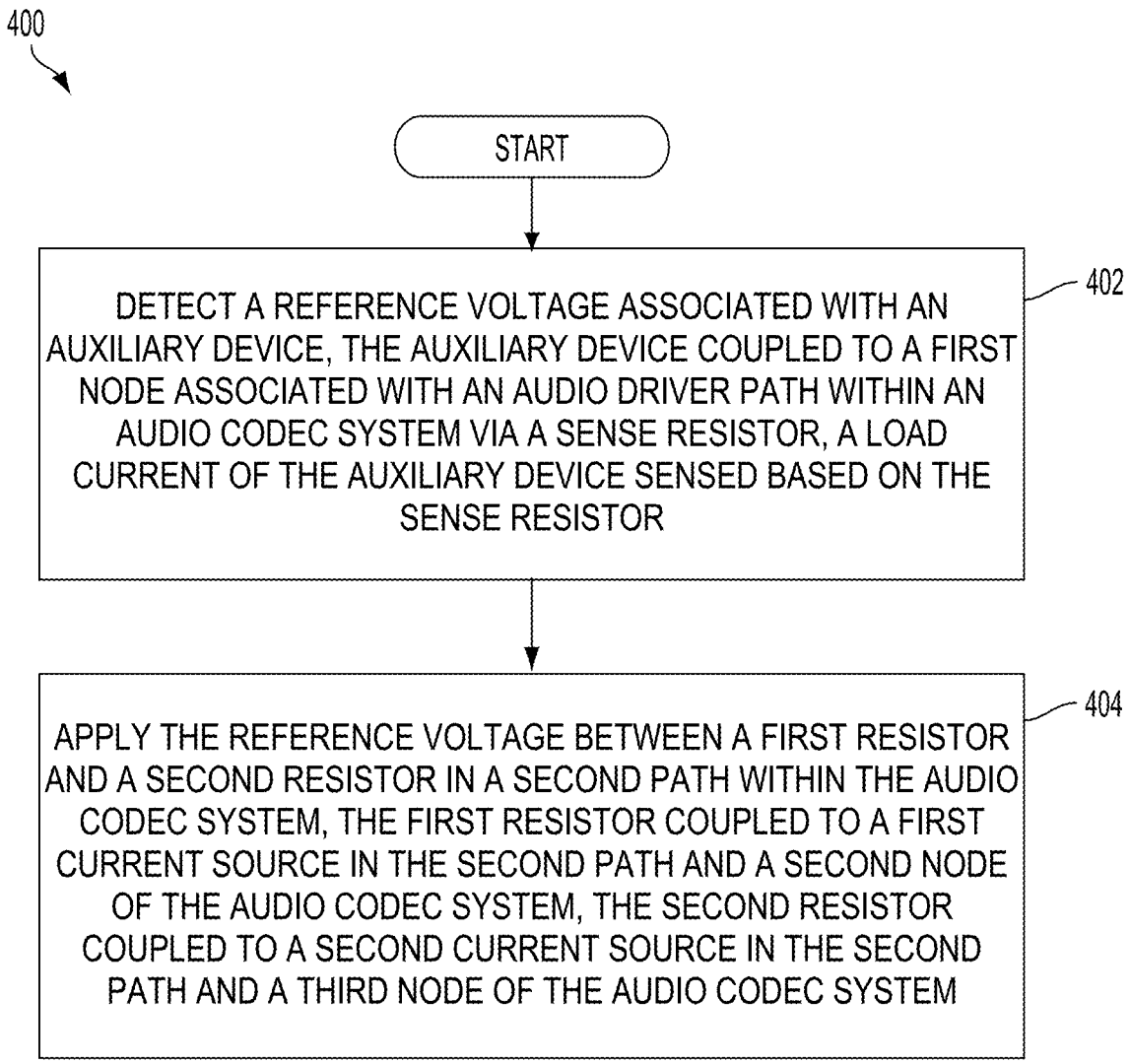
FIG. 4 illustrates a method for reducing board-level noise when sensing a load current of an auxiliary device by an audio codec system.

FIG. 4 illustrates a method 400 for reducing board-level noise when sensing a load current of an auxiliary device by an audio codec system. The method may be implemented in an audio codec system. At block 402, a reference voltage associated with the auxiliary device is detected. The auxiliary device is coupled to a first node via a sense resistor where the first node is associated with an audio driver path within the audio codec system. The load current is sensed based on the sense resistor. For example, a voltage is detected across the sense resistor and the current is determined based on the voltage and the sense resistance. At block 404, the reference voltage is applied between a first resistor and a second resistor in a second path (e.g., a voltage-in/digital-out path) within the audio codec system. The first resistor is coupled to a first current source in the second path and a second node of the audio codec system. The second resistor is coupled to a second current source in the second path and a third node of the audio codec system.

According to one aspect of the present disclosure, an audio codec system is described. The audio codec system includes first means for biasing the audio codec system and a second means for biasing the audio codec system. The first biasing means may, for example, be the first current source $I_1$, the first resistor $R_1$, the third resistor (not shown), and/or any combination thereof. The second biasing means may, for example, be the second current source $I_2$, the second resistor $R_2$, the fourth resistor (not shown), and/or any combination thereof. In another aspect, the aforementioned means may be any module or any apparatus or material configured to perform the functions recited by the aforementioned means.

Figure 5:
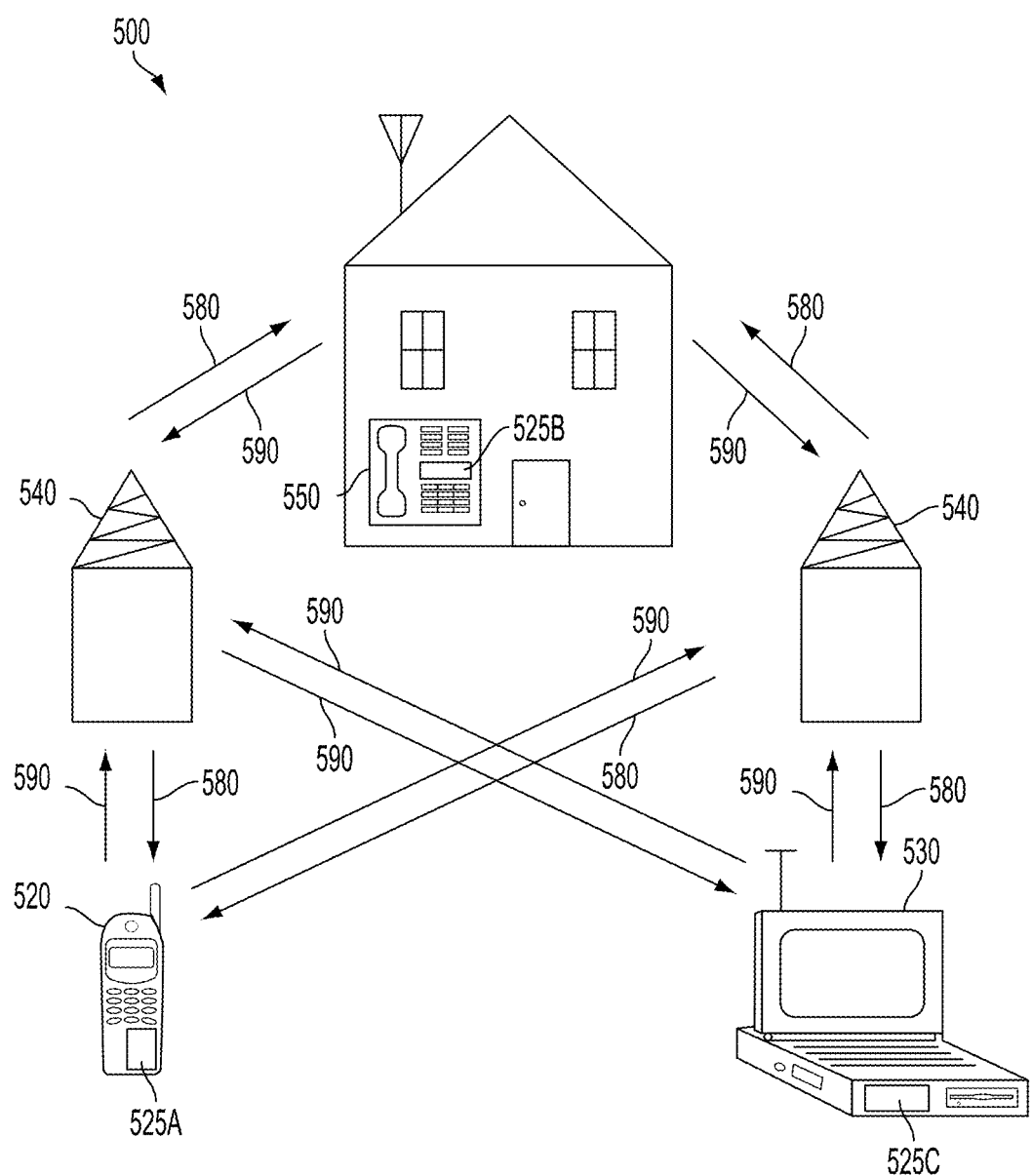
FIG. 5 is a block diagram showing an exemplary wireless communications system in which an aspect of the disclosure may be advantageously employed.

FIG. 5 is a block diagram showing an exemplary wireless communications system 500 in which an aspect of the disclosure may be advantageously employed. For purposes of illustration, FIG. 5 shows three remote units 520, 530, and 550 and two base stations 540. It will be recognized that wireless communications systems may have many more remote units and base stations. Remote units 520, 530, and 550 include IC devices 525A, 525C, and 525B that include the disclosed audio codec system. However, for a wireless auxiliary device the audio codec system and the corresponding external features are included in the wireless auxiliary device. It will be recognized that other devices may also include the disclosed audio codec system, such as the base stations, user equipment, and network equipment. FIG. 5 shows forward link signals 580 from the base station 540 to the remote units 520, 530, and 550, and reverse link signals 590 from the remote units 520, 530, and 550 to base station 540.

In FIG. 5, remote unit 520 is shown as a mobile telephone, remote unit 530 is shown as a portable computer, and remote unit 550 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as meter reading equipment, or other communications device that stores or retrieves data or computer instructions, or combinations thereof. Although FIG. 5 illustrates remote units according to aspects of the present disclosure, the disclosure is not limited to these exemplary illustrated units. Aspects of the present disclosure may be suitably employed in many devices, which include the disclosed audio codec system.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communications networks and/or communications technologies. The apparatuses, methods, and systems disclosed herein may also be implemented digitally and differentially, among others. The various components illustrated in the figures may be implemented as, for example, but are not limited to, software and/or firmware on a processor, ASIC/FPGA/DSP, or dedicated hardware. In addition, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, include compact disc (CD), laser disc, optical disc, digital versatile disc (DVD), floppy disk, and Blu-ray disc, where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. An audio codec system comprising:
   an audio driver path coupled to a first node of the audio codec system;
   a second path comprising:
      a first bias circuit coupled to a second node of the audio codec system;
      a second bias circuit coupled to a third node of the audio codec system; and
      wherein a first terminal of a sense resistor external to the audio codec system is couplable to the first node and a second terminal of the sense resistor is couplable to an auxiliary device load and wherein an off-chip voltage reference associated with the auxiliary device load is couplable between the first bias circuit and the second bias circuit.

2. The audio codec system of claim 1, in which the sense resistor is couplable between the second node and the third node.

3. The audio codec system of claim 1, in which the auxiliary device load comprises a headphone load, or a speaker load.

4. The audio codec system of claim 1, in which the second node is couplable to a first capacitor, the first capacitor between the second node and the second terminal of the sense resistor.

5. The audio codec system of claim 1, in which the third node is couplable to a second capacitor, the second capacitor between the first node and the third node of the audio codec system.

6. The audio codec system of claim 1, in which the audio driver path comprises a power amplifier.

7. The audio codec system of claim 1, in which the second path comprises a differential signal as input and an output signal that is a function of a differential input signal.

8. The audio codec system of claim 1, in which the first bias circuit comprises a first current source coupled to a first resistor and the second bias circuit comprises a second current source coupled to a second resistor, and in which the off-chip voltage reference is couplable between the first resistor and the second resistor.

9. The audio codec system of claim 8, in which the first current source and the second current source are coupled to a supply voltage referenced to ground.

10. The audio codec system of claim 1, in which the first bias circuit comprises a first resistor coupled to a third resistor and the second bias circuit comprises a second resistor coupled to a fourth resistor, and in which the off-chip voltage reference is couplable between the first resistor and the second resistor.

11. The audio codec system of claim 10, in which the third resistor and the fourth resistor are coupled to a supply voltage referenced to the off-chip voltage reference.

12. An audio codec system comprising:
   an audio driver path coupled to a first node of the audio codec system, a first terminal of a sense resistor external to the audio codec system coupled to the first node and a second terminal of the sense resistor coupled to an auxiliary device load; and
   a second path comprising:
      first means for biasing the audio codec system, the first biasing means coupled to a second node of the audio codec system;
      second means for biasing the audio codec system, the second biasing means coupled to a third node of the audio codec system; and
      an off-chip voltage reference associated with the auxiliary device load coupled between the first biasing means and the second biasing means.

13. The audio codec system of claim 12, in which the sense resistor is coupled between the second node and the third node.

14. The audio codec system of claim 12, in which the auxiliary device load comprises a headphone load, or a speaker load.

15. The audio codec system of claim 12, in which the second node is coupled to a first capacitor, the first capacitor between the second node and the second terminal of the sense resistor.

16. The audio codec system of claim 12, in which the third node is coupled to a second capacitor, the second capacitor between the first node and the third node of the audio codec system.

17. The audio codec system of claim 12, in which the audio driver path comprises a power amplifier.

18. The audio codec system of claim 12, in which the second path comprises a differential signal as input and an output signal that is a function of a differential input signal.

19. A method for reducing board-level noise when sensing a load current of an auxiliary device by an audio codec system, the method comprising:
   detecting a reference voltage associated with the auxiliary device, the auxiliary device coupled to a first node, associated with an audio driver path within the audio codec system, via a sense resistor, the load current being sensed based on the sense resistor; and
   applying the reference voltage between a first resistor and a second resistor in a second path within the audio codec system, the first resistor coupled to a first current source in the second path and a second node of the audio codec system, the second resistor coupled to a second current source in the second path and a third node of the audio codec system.

20. A method for reducing board-level noise when sensing a load current of an auxiliary device by an audio codec system, the method comprising:
   detecting a reference voltage associated with the auxiliary device, the auxiliary device coupled to a first node, associated with an audio driver path within the audio codec system, via a sense resistor, the load current sensed based on the sense resistor; and
   applying the reference voltage between a first resistor and a second resistor in a second path within the audio codec system, the first resistor coupled to a third resistor in the second path and a second node of the audio codec system, the second resistor coupled to a fourth resistor in the second path and a third node of the audio codec system.

* * * * *